United States Patent
Standing

(10) Patent No.: US 9,978,719 B2
(45) Date of Patent: May 22, 2018

(54) ELECTRONIC COMPONENT, ARRANGEMENT AND METHOD

(71) Applicant: Infineon Technologies Austria AG, Villach (AT)

(72) Inventor: Martin Standing, Villach (AT)

(73) Assignee: Infineon Technologies Austria AG, Villach (AT)

( * ) Notice: Subject to any disclaimer, the term of this patent is extended or adjusted under 35 U.S.C. 154(b) by 461 days.

(21) Appl. No.: 14/165,759

(22) Filed: Jan. 28, 2014

(65) Prior Publication Data

US 2015/0216054 A1    Jul. 30, 2015

(51) Int. Cl.
*B23K 1/00*    (2006.01)
*H01L 25/065*    (2006.01)
(Continued)

(52) U.S. Cl.
CPC ........ *H01L 25/0657* (2013.01); *B23K 1/0016* (2013.01); *H01L 25/165* (2013.01); *H05K 1/144* (2013.01); *H05K 3/3426* (2013.01); *H05K 3/3484* (2013.01); *H01L 2224/18* (2013.01); *H01L 2924/0002* (2013.01); *H01L 2924/13055* (2013.01); *H05K 3/3436* (2013.01);
(Continued)

(58) Field of Classification Search
CPC ........... H01L 2224/97; H01L 2924/014; H01L 2924/15311; H01L 2224/32225; H01L 2924/181; H01L 23/3128; H01L 24/96; H05K 3/3436; H05K 1/185; H05K 2201/09136; H05K 1/186; H05K 2201/10734; H05K 1/0231

USPC .......... 228/173.1, 179.1, 203; 257/E21.499, 257/E21.502
See application file for complete search history.

(56) References Cited

U.S. PATENT DOCUMENTS 5,320,272 A * 6/1994 Melton ................ B23K 35/007
                                                           228/180.21
6,278,264 B1    8/2001 Burstein et al.
(Continued)

FOREIGN PATENT DOCUMENTS

| CN | 101276809 A | 10/2008 |
| CN | 101843181 A | 9/2010 |
| CN | 102074556 A | 5/2011 |

OTHER PUBLICATIONS

Author Unknown. "High-Performace DrMOS." Data Sheet, Revision 1.9. Infineon Technologies AG, Mar. 2011. pp. 1-26.
(Continued)

*Primary Examiner* — Erin B Saad
(74) *Attorney, Agent, or Firm* — Murphy, Bilak & Homiller, PLLC

(57) ABSTRACT

A method includes applying solder paste to a portion of a circuit board, arranging a first contact pad of a first electronic component adjacent the layer of solder paste, the first electronic component comprising a dielectric layer, at least one semiconductor die embedded in the dielectric layer, the at least one first contact pad being electrically coupled to the semiconductor die and arranged on a lower side of the dielectric layer, and at least one second contact pad positioned on an upper side of the dielectric layer, and melting the solder paste to produce a molten solder that flows onto at least one of the first contact pad and the second contact pad of the first electronic component.

23 Claims, 11 Drawing Sheets

(51) Int. Cl.
*H01L 25/16* (2006.01)
*H05K 1/14* (2006.01)
*H05K 3/34* (2006.01)

(52) U.S. Cl.
CPC .............. *H05K 2201/041* (2013.01); *H05K 2201/10515* (2013.01); *H05K 2203/1476* (2013.01); *Y02P 70/613* (2015.11)

(56) References Cited

U.S. PATENT DOCUMENTS

| | | | |
|---|---|---|---|
| 6,660,944 B1* | 12/2003 | Murata | H01L 21/4853 |
| | | | 174/250 |
| 2003/0090007 A1 | 5/2003 | Fischbach et al. | |
| 2010/0230472 A1* | 9/2010 | Okamoto | H05K 3/3436 |
| | | | 228/104 |
| 2012/0120609 A1* | 5/2012 | Chou | H01L 21/568 |
| | | | 361/708 |
| 2013/0176013 A1 | 7/2013 | Takemae et al. | |

OTHER PUBLICATIONS

Standing, et al. "Thales." Invention Disclosure. Infineon Technologies Group and Affiliated Companies, Oct. 2010. pp. 1-17.

* cited by examiner

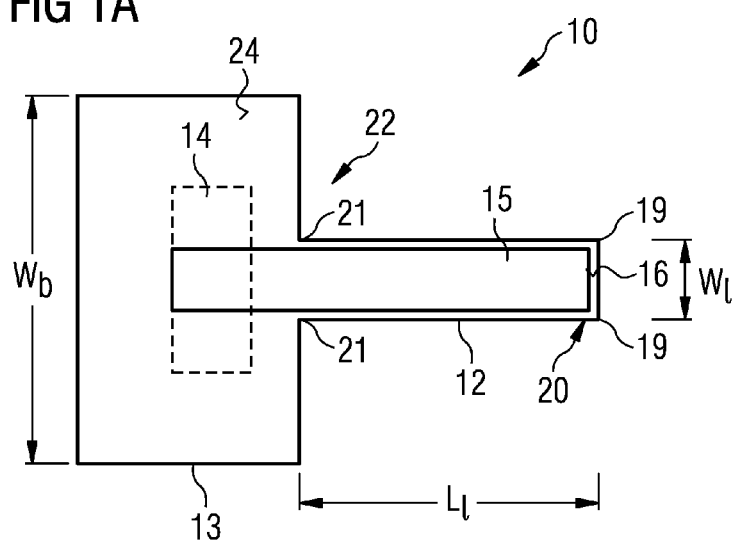
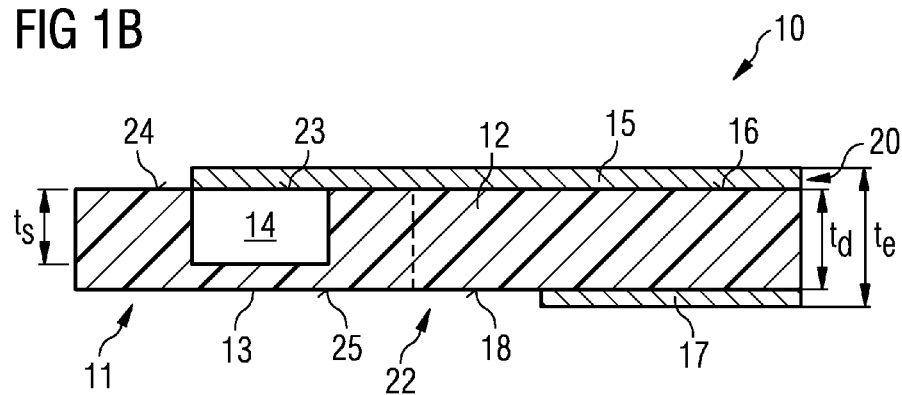

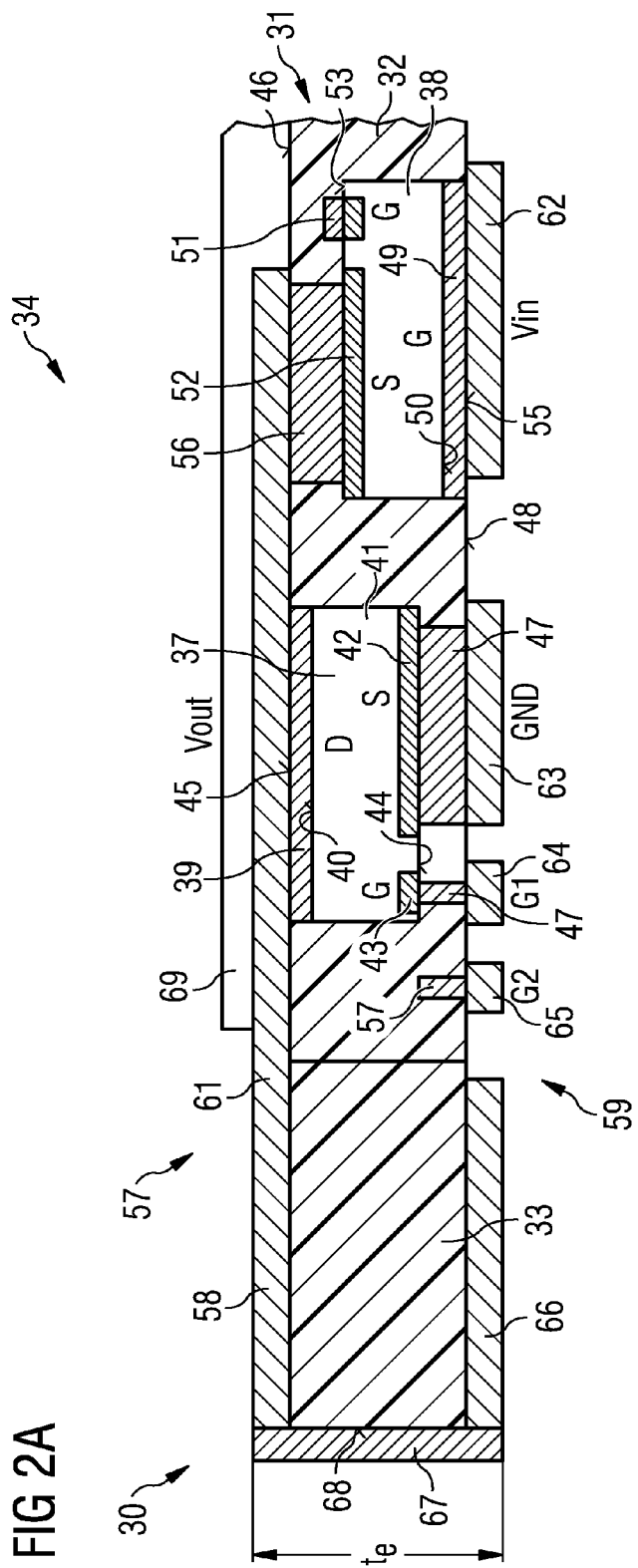

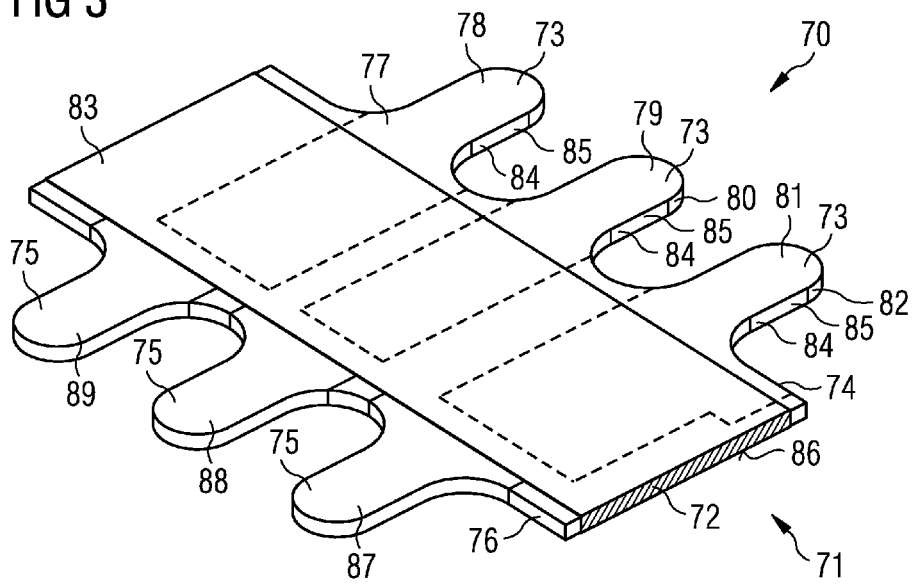

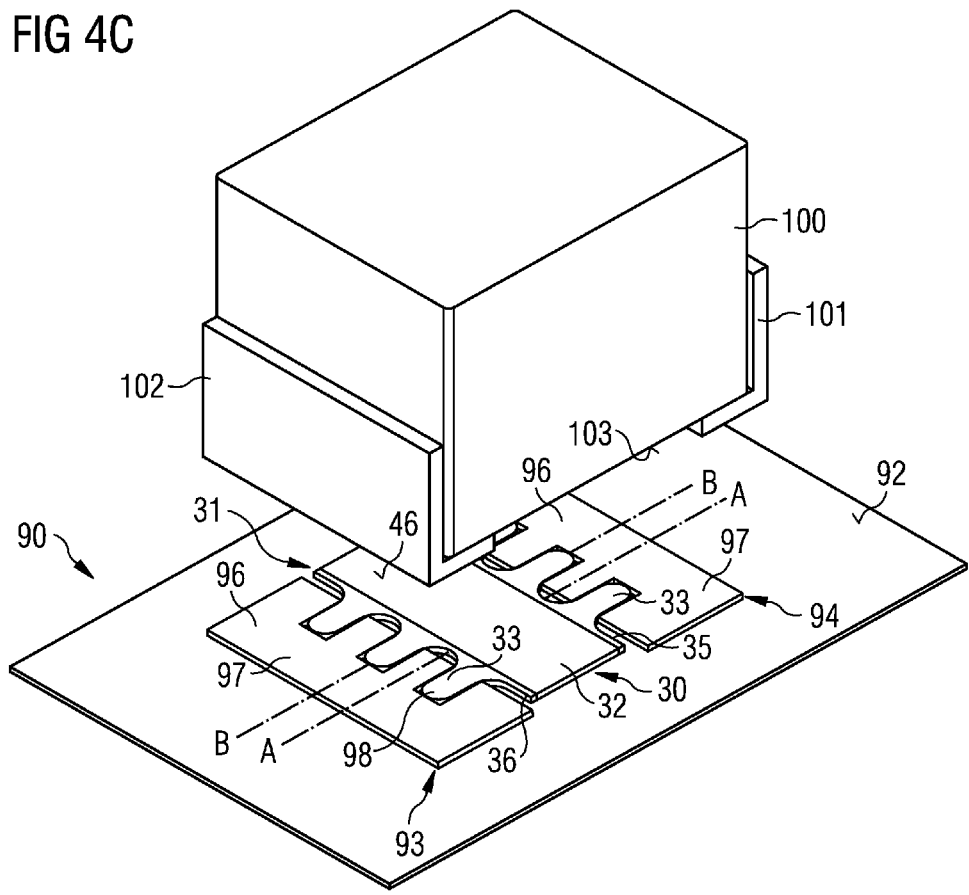

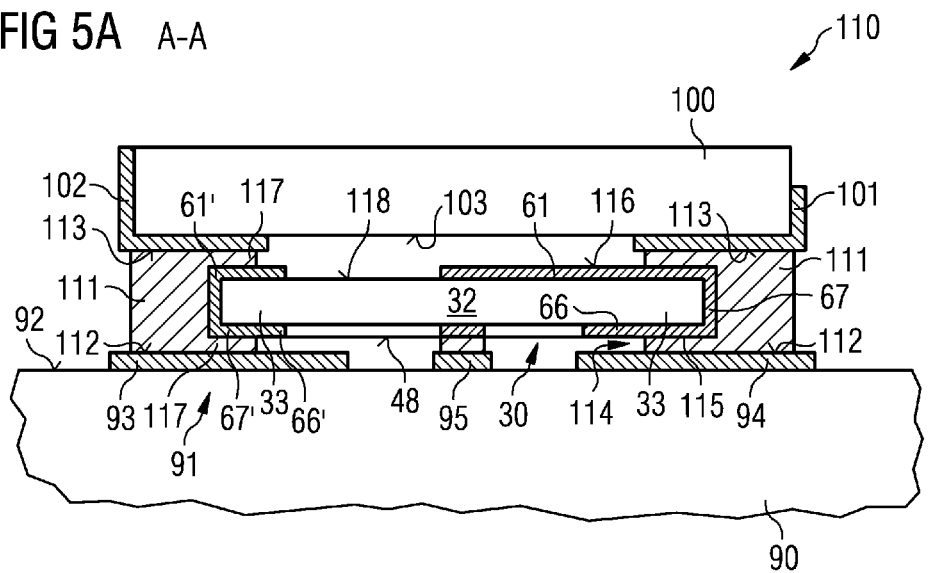
FIG 5A A-A
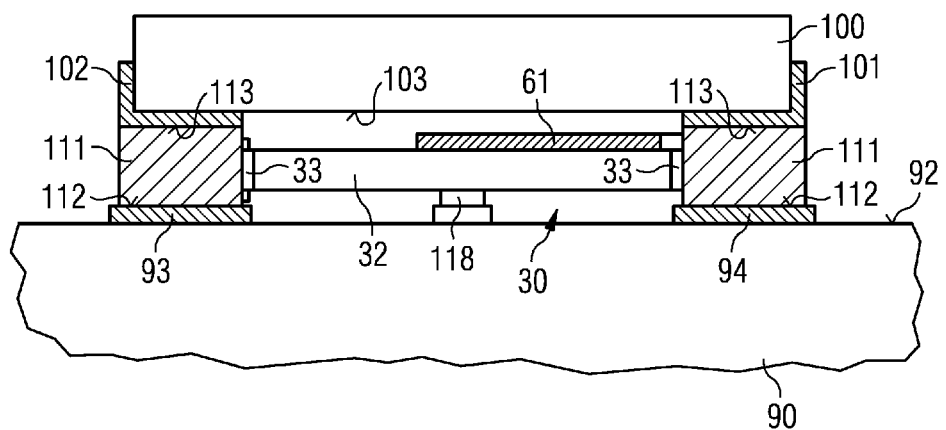
FIG 5B B-B

ELECTRONIC COMPONENT, ARRANGEMENT AND METHOD

BACKGROUND

Semiconductor devices may be packaged using various packaging technologies to provide semiconductor packages having differing outlines, differing footprints and differing types of outer contacts. For example, a package may include pins, or solder balls as outer contacts which allow the package to be mounted onto a circuit board.

Semiconductor devices may be used in many electronic and other applications along with further electronic components such as inductors, resistors etc. Typically, the semiconductor devices and further electronic components are mounted on a printed circuit board which includes a conductive redistribution structure to form a desired circuit or application.

SUMMARY

In an embodiment, a method includes: applying solder paste to a portion of a circuit board; arranging a first contact pad of a first electronic component adjacent the layer of solder paste, the first electronic component comprising a dielectric layer, at least one semiconductor die embedded in the dielectric layer, the at least one first contact pad being electrically coupled to the semiconductor die and arranged on a lower side of the dielectric layer, and at least one second contact pad positioned on an upper side of the dielectric layer, and melting the solder paste to produce a molten solder that flows onto at least one of the first contact pad and the second contact pad of the first electronic component.

In an embodiment, an electronic component includes a dielectric layer including at least one limb portion extending from a body portion, at least one semiconductor die embedded in the body portion, at least one first contact pad positioned on an upper side of the at least one limb portion and at least one second contact pad positioned on a lower side of the at least one limb portion. The at least one first contact pad is electrically coupled to the at least one semiconductor die. In an embodiment, an arrangement includes a circuit board including a circuit board contact pad; a first electronic component including a dielectric layer comprising at least one first limb portion extending from a body portion, at least one semiconductor die embedded in the body portion and at least one first contact pad positioned on an upper side of the at least one limb portion and at least one second contact pad positioned on a lower side of the at least one limb portion, the at least one first contact pad being electrically coupled to the at least one semiconductor die, and a second electronic component. A first contact of the second electronic component is mounted on the at least one first limb portion of the first electronic component and on the circuit board contact pad.

In an embodiment, a method includes applying solder paste to a portion of a circuit board contact pad of a circuit board, a further portion of the circuit board contact pad remaining substantially free of the solder paste, arranging a limb portion of a first electronic component on the further portion of the circuit board contact pad, the first electronic component including a dielectric layer including the limb portion extending from a body portion, at least one semiconductor die embedded in the body portion and at least one contact pad positioned on an upper side of the limb portion and at least one second contact pad positioned on a lower side of the limb portion, the at least one first contact pad being electrically coupled to the at least one semiconductor die, and arranging a first contact of a second electronic component on the limb portion of the first electronic component and on the solder paste and melting the solder paste.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1a illustrates a top view of an electronic component according to a first embodiment.

FIG. 1b illustrates a cross-sectional view of the electronic component according to the first embodiment.

FIG. 2a illustrates a cross-sectional view of an electronic component according to a second embodiment.

FIG. 3 illustrates a perspective view of the top side of an electronic component according to a third embodiment.

FIG. 4c illustrates mounting of a first electronic component and a second electronic component on the printed circuit board.

FIG. 5a illustrates a cross-sectional view of the first electronic component and the second electronic component mounted on the circuit board.

FIG. 5b illustrates a second cross-sectional view of the first electronic component and the second electronic component mounted on the circuit board.

DETAILED DESCRIPTION

Figure 2B:
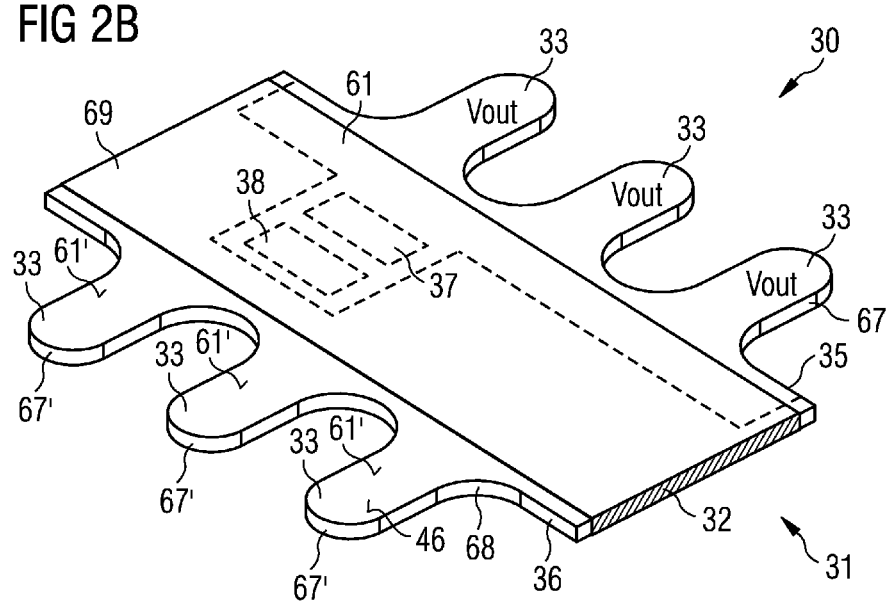
FIG. 2b illustrates a perspective view of the top side of the electronic component according to the second embodiment.

In the following detailed description, reference is made to the accompanying drawings, which form a part hereof, an in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

As used herein, a "high-voltage device", such as a high-voltage depletion-mode transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, a "low-voltage device", such as a low-voltage enhancement-mode transistor, is an electronic device which is capable of blocking low voltages, such as between 0 V and $V_{low}$, but is not capable of blocking voltages higher than $V_{low}$. $V_{low}$ may be about 10 V, about 20 V, about 30 V, about 40 V, or between about 5 V and 50 V, such as between about 10 V and 30 V.

FIG. 1a illustrates a top view and FIG. 1b illustrates a cross-sectional view of an electronic component 10 according to a first embodiment. The electronic component 10 includes a dielectric layer 11 including at least one limb portion 12 extending from a body portion 13. The electronic component 10 further includes at least one semiconductor die 14 embedded in the body portion 13 of the dielectric layer 11. The electronic component 10 has at least one first contact pad 15 positioned on an upper side 16 of the limb portion 12 and at least one second contact pad 17 positioned on a lower side 18 of the limb portion 12. The at least one first contact pad 15 is electrically coupled to the semiconductor die 14.

The dielectric layer 11 may be provided by a board such as a glass fibre reinforced epoxy resin board, for example FR4. Such boards may also be used as the core layer in a redistribution board such as a printed circuit board.

The dielectric layer 11 has a lateral shape defining the body portion 13 and the limb portion 12. The body portion 13 and the at least one limb portion 12 are substantially coplanar and have a thickness $t_d$ which is substantially similar to a thickness $t_s$ of the semiconductor die 14. In the illustrated embodiment, the thickness $t_d$ of the body portion 13 and of the limb portion 12 is slightly greater than the thickness $t_s$ of the semiconductor die 14. For example, $t_d$ may be at most three times $t_s$. The limb portion 12 has a width $w_l$ and a length $l_l$. The width $w_l$ of the limb portion 12 is less than a width $w_b$ of the body portion 13 of the dielectric layer 11. The limb portion 12 may also be described as a finger.

The limb portion 12 includes the first upper contact pad 15 separated from the second lower contact pad 17 by a portion of the dielectric layer 11. The first upper contact pad 15 substantially covers the upper side 16 of the limb portion 12. However, the first upper contact pad 15 is not limited to this arrangement and may cover only a portion of the limb portion 12 or substantially the entire upper side 16 of the limb portion 12. The limb portion 12 provides an outer contact of the electronic component 10 which has a thickness which is substantially the same as the thickness of the portion of the electronic component 10 housing the semiconductor die 14. The side faces of the limb portions 12 may be substantially covered by a conductive layer that electrically couples the first contact pad 15 to the second contact pad 17.

Whilst the body portion 13 and limb portion 12 of the dielectric layer 11 are illustrated in FIG. 1a as having a rectangular form with sharp edges, the lateral shape of the body portion 13 and the limb portion 12 is not limited to this arrangement. For example, the body portion 13 may be square, the distal end 20 of the limb portion 12 may be curved or semi-circular and/or the edges may be rounded. In another example, the edges 19 are positioned at the distal end 20 of the limb portion 12 and the edges 21 formed between the proximal end 22 of the limb portion 12 where it joins the body portion 13 may be rounded.

In the electronic component 10 according to the first embodiment, the semiconductor die 14 is embedded within the body portion 13 of the dielectric layer 11 such that the upper surface 23 of the semiconductor die 14 is exposed from the dielectric layer 11. The first contact pad 15 on the upper side 16 extends from the distal end 20 of the limb portion 12 onto the upper surface 24 of the body portion 13 and onto the upper surface 23 of the semiconductor die 14 in order to electrically couple the first contact pad 15 to the semiconductor die 14.

The first contact pad 15 includes an electrically conductive material such as a metal or an alloy. The first contact pad 15 may include copper. The contact pad 15 may also have a multilayer structure including differing materials. For example, the first contact pad 15 may include a lower layer to improve adhesion to the dielectric layer 11 and/or semiconductor die 14 and one or more upper layers having a low resistivity.

The second contact pad 17 may include the same material and have the same structure as the first contact pad 15 or may include a different material or have a different structure.

In embodiments in which the semiconductor die 14 is embedded entirely within the dielectric layer 11, one or more conductive vias may be provided which extend from the semiconductor die 14 to the outer surface of the dielectric layer 11 so that the conductive material of the first contact pad 15 makes contact with the exposed portion of the conductive via(s) so that the first contact pad 15 is electrically coupled to the semiconductor die 14 by way of the conductive via(s).

The first contact pad 15 may be considered to provide a redistribution structure of the electronic component 10. Since the limb portion 12 extends from the body portion 13 and the first contact pad 15 and the second contact pad 17 are positioned on the limb portion 12, the limb portion 12 provides a so-called fan-out arrangement for the contacts on the semiconductor die 14. The fan out arrangement enables the first contact pad 15 and the second contact pad 17 to have a larger area and be spaced further apart from one another compared to the corresponding contact pad(s) on the semiconductor die 14.

The dielectric layer 11 is substantially planar so that the upper surface 24 of the body portion 13 is coplanar with the upper side 16 of the limb portion 12 and a lower surface 25 of the body portion 13 is coplanar with the lower side 18 of the limb portion 12. The dielectric layer has a lateral form which is shaped to provide the body portion 13, in which the semiconductor die 14 is embedded, and one or more limb portions 12, which provide one or more outer contacts. This shape of the dielectric layer 11 enables the electronic component 10 to have a low height. In particular, the overall height of the electronic component 10 is only slightly greater than the thickness $t_d$ of the dielectric layer 11. In embodiments in which the dielectric layer 11 is provided by a glass-fibre reinforced epoxy resin board, such as FR4, the height of the package is only slightly greater than the thickness of the board.

For example, the first contact pad 15 and the second contact pad 17 may each have a thickness of around 20 μm and the dielectric layer 11 may have a thickness of around 100 μm. The semiconductor die 14 may have a thickness $t_s$ which is around 30% of a total height $t_e$ of the electronic component 10.

The semiconductor die 14 may be a power device such as a power transistor, for example a MOSFET or Insulated Gate Bipolar Transistor (IGBT), and may be a high voltage transistor.

The semiconductor die 14 may be arranged in a recess in the body portion 13 of the dielectric layer 11 in order to embed the semiconductor die 14 in the body portion 13. Adhesive may be arranged in the recess to secure the semiconductor die within the recess of the dielectric layer. The semiconductor die 14 may be embedded directly in the dielectric layer 11 so that at least the side faces of the semiconductor die 14 are in direct contact with the material of the dielectric layer 11.

In further embodiments, the electronic component 10 includes two or more semiconductor dies embedded within the body portion 13. The semiconductor dies embedded within the body portion 13 may be electrically coupled to one another to provide a particular circuit, such as a half-bridge circuit. The electronic component 10 may also provide a power stage including a half-bridge circuit. The power stage may also include a gate driver circuit embedded in the body portion 13 or other control circuitry. The substantial part of a point of load (PoL) may be created by the addition of a controller and driver to the half-bridge (synchronous-buck). The partitioning of this circuit control is not limited to the classical controller, driver, FET arrangement, but covers also other methods of driving such as direct-driven gates. The circuits may also provide sophisticated sensing arrangements for monitoring circuit functions.

The electronic component 10 is not limited to having a single limb portion 12, but may also include more than one limb portion 12. For example, two or more limb portions may extend from a single side of the body portion 13 or one or more limb portions may extend from two or more sides of the body portion 13. For example, one or more limb portions may extend from opposing sides of the body portion 13.

Figure 2C:
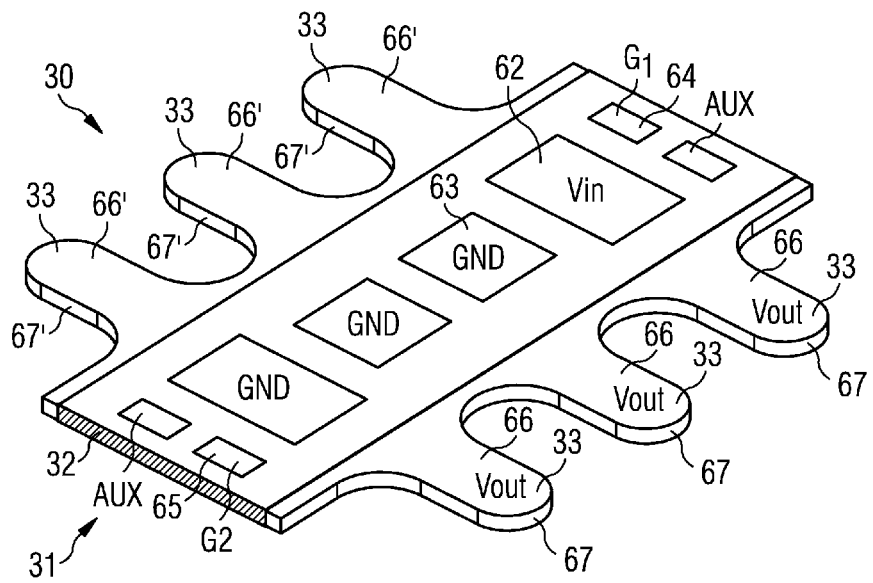
FIG. 2c illustrates a perspective view of the underside of the electronic component according to the second embodiment.

FIG. 2a illustrates a cross-sectional view, FIG. 2b illustrates a perspective view of the top side and FIG. 2c illustrates a perspective view of the underside of an electronic component 30 according to a second embodiment. The electronic component 30 includes a dielectric layer 31 in the form of a glass fibre-reinforced epoxy resin board which is shaped to provide a body portion 32 having a substantially rectangular shape and six limb portions 33. Three limb portions 33 extend from a first long side 35 of the rectangular body portion 32 and three limb portions 33 extend from the opposing long side 36 of the rectangular body portion 32.

The electronic component 30 includes a half-bridge circuit 34 including a first transistor device 37 and a second transistor device 38 which are embedded in the body portion 32 of the dielectric layer 31. The first transistor device 37 is the low side switch and the second transistor device 38 is the high side switch of the half-bridge circuit 34. The first transistor 37 includes a drain electrode 39 positioned on an upper surface 40 of a silicon body 41 and a source electrode 42 and a gate electrode 43 positioned on a lower surface 44 of the silicon body 41.

The first transistor device 37 is embedded within the body portion 32 of the dielectric layer 31 such that the upper surface 45 of the drain electrode 39 is substantially coplanar with the upper surface 46 of the dielectric layer 31. The source electrode 42 and the gate electrode 43 are positioned within the volume of the body portion 32. Conductive vias 47 are provided in the body portion 32 which extend from the source electrode 42 to a lower surface 48 of the dielectric layer 31 and from the gate electrode 43 to the lower surface 48 of the dielectric layer 31.

The second transistor device 38 includes a drain electrode 49 on its lower surface 50 and a gate electrode 51 and a source electrode 52 on its upper surface 53. The second transistor device 38 is embedded within the body portion 32 such that a lower surface 55 of the drain electrode 49 is substantially coplanar with the lower surface 48 of the dielectric layer 31. The gate electrode 51 and source electrode 52 are positioned within the dielectric layer 31 so that a conductive via 56 is provided which extends from the source electrode 52 to the upper surface 46 of the dielectric layer 31.

The electronic component 30 further includes a rewiring structure 57. The rewiring structure 57 includes contact pads 58 arranged on the upper surface 46 and on the lower surface 48 of the dielectric layer 31, conductive traces 59 positioned on the upper surface 46 and on the lower surface 48 of the dielectric layer 31 and conductive traces 60 positioned within the dielectric layer 31.

The electronic component 30 includes a first trace 61 which extends between the drain electrode 39 of the first transistor device 37 and the conductive via 56 which is electrically coupled to the source electrode 52 of the second transistor device 38. The first trace 61 extends onto the three limb portions 33 of the dielectric layer 31 which extend from the first long side 35 of the body portion 32. Exposed regions of the first trace 61 positioned on the limb portions 33 provide outer contacts for the electronic component 30.

The electronic component 30 further includes a first contact pad 62 on the drain electrode 49 of the second transistor device 38 which also extends onto the lower surface 48 of the dielectric layer. The first contact pad 62 is electrically coupled to the drain electrode 49 of the second transistor device 38. A second contact pad 63 is positioned on the lower surface 48 of the dielectric layer 31 and is coupled to the source electrode 42 of the first transistor device 37 by way of the conductive via 47. A third contact pad 64 is arranged on the lower surface 48 of the dielectric layer 31 and is positioned on the conductive via 47 which is coupled to the gate 43 of the first transistor device 37. A fourth contact pad 65 is positioned on the lower surface 48 of the dielectric layer 31 and is electrically coupled to the gate electrode 51 of the second transistor device 38 by a rewiring structure 57 positioned within the dielectric layer 31.

The contact pads 62, 63, 64 and 65 positioned on the lower surface 48 of the dielectric layer 31 of the body portion 32 provide surface mountable outer contacts for the electronic component 30. The first contact pad 62 provides a $V_{in}$ contact, the second contact pad 63 provides a Ground contact, the third contact pad 64 provides a first gate contact and the fourth contact pad 65 provides a second gate contact for the half-bridge circuit 34.

The limb portions 33 extending from the first long side 35 further include a contact pad 66 positioned on the lower surface 48 of the dielectric layer 31 of the limb portion 33. The contact pad 66 is electrically coupled to the first trace 61 on the upper surface 46 of the dielectric layer 31 of the limb portion 33 by one or more electrically conductive traces 67 positioned on a side face 68 of the limb portions 33. The first trace 61 and the contact pad 66 provide the $V_{out}$ contact of the half-bridge circuit 34. The $V_{out}$ contact may be accessed from the lower side and/or from the upper side of the electronic component 30.

The electrically conductive trace 67 may cover substantially the entire side face 68 of the limb portions 33. This arrangement may be used to assist in improving the conductivity of the contact arrangement including the first trace 61, contact pad 66 and conductive trace 67.

The limb portions 33 extending from the opposing long side 36 may also include a contact pad 61' arranged on the upper surface 46 of the dielectric layer, a contact pad 66' arranged on the lower surface 48 of the dielectric layer 31 and one or more conductive traces 67' arranged on the side face 68 which electrically couple the contact pad 61' to the contact pad 66'. The contact pads 61, 66' are, however, not electrically coupled to a further component of the electronic component 30 such as the first transistor 37 or the second transistor 38. The contact pads 61', 66' provide dummy contact pads which enable the electronic component 30 to be soldered onto a circuit board by a solder connection between the contact pads 61', 66' and the circuit board for mechanical purposes. The contact pads 61, 66' may form part of an electrical connection between the circuit board and a further electronic component.

The electronic component 30 may further include an insulation layer 69 which covers the trace 61 providing the $V_{out}$ contact in regions arranged on the body portion 32. Regions of the first trace 61 arranged on the limb portions 33 remain uncovered by the insulation layer 69. Similarly, regions of the contact pad 61' arranged on the limb portions 33 extending from the second side 36 of the body portion 32 remain uncovered by the insulation layer 69.

The lateral layout of the first trace 61 and of contact pads 62, 63, 64, 65 are illustrated in the top view of FIG. 2b and in the bottom view of FIG. 2c, respectively.

In the top view of the electronic component 30 illustrated in FIG. 2b, the position of the first transistor device 37, the second transistor device 38 and the first conductive trace 61 are indicated with dashed lines in the body portion 32, since they are positioned underneath the insulation layer 69. The first trace 61 has a lateral extent such that it covers the lateral extent of the first transistor device 37 and the second transistor device 38. The first trace 61 electrically couples the drain electrode 39 of the first transistor device 37 to the source electrode 52 of the second transistor device 38. The first trace 61 has an increased lateral area in regions adjacent the first long side 35 of the body portion 32 such that the first trace 61 extends over substantially the entire upper surface 46 of the limb portions 33. However, the lateral extent of the first trace 61 is not limited to the shape illustrated in FIG. 2b and may have other forms.

The second pad 61' arranged on the upper surface 46 of the limb portions 33 extending from the second long side 36 of the body portion 32 extends over substantially the entire upper surface 46 of the limb portions 33.

The contact pads 62, 63, 64, 65 arranged on the lower surface 48 of the dielectric layer 31 of the body portion 32 are illustrated the perspective bottom view of the electronic component 30 in FIG. 2c. The arrangement and sizes of the contact pads 62, 63, 64, 65 are not limited to the shape illustrated in FIG. 2c and may have other arrangements and sizes. In addition to the contact pads 62, 63, 64, 65 which provide the $V_{in}$, Ground, Gate1 and Gate2 pads of the electronic component 30, respectively, the footprint may include one or more further auxiliary pads (Aux) which may be used for providing sense functions, such as current sensing and/or source sensing. The transistor providing the low side switch of the half-bridge circuit may also be coupled to one or more further Ground pads. The two gate pads may be arranged at opposing ends of the body portion 32, with the larger area Ground terminals arranged adjacent the smaller area Gate2 pad and the larger area $V_{in}$ terminal arranged adjacent the Gate1 pad. The smaller area Auxiliary pads may be arranged adjacent the gate pads. The $V_{out}$ pad 61, 66 is provided on the limb portions 33 arranged on only one side of the electronic component 30 and is arranged adjacent the remaining pads 62, 63, 64, 65 of the footprint.

The lower surfaces 48 of the three limb portions 33 each include a contact pad 66 which provides a surface mountable contact pad of the electronic component 30. The contact pads 66 are electrically coupled to the first trace 61 providing the outer contact of the electronic component 30 by electrically conductive traces 67 extending from the first trace 61 to the contact pad 66 and arranged on the side face 68 of the limb portions 33. The contact pads 66 arranged on each limb portion 33 may also be electrically coupled to each other by providing a single contact pad 66 which extends over the lower surface 48 of all three limb portions 33.

The contact pads 66' arranged on the lower surface 48 of the limb portions 33 extending from the opposing long side 36 of the body portion 32 may also form part of a common contact pad which extends over all three limb portions 33. The contact pads 66' may be electrically coupled by a single or more than one conductive trace 67' arranged on the side face 68 to the contact pad 61' arranged on the upper surface 46.

FIG. 3 illustrates a perspective top view of an electronic component 70 according to a third embodiment. The electronic component 70 includes a dielectric layer 71 including a substantially rectangular body portion 72 and three limb portions 73 extending from the first long side 74 of the body portion 72 and three limb portions 75 extending from the opposing long side 76 of the body portion 72. The general shape of the electronic component 70 is substantially similar to that of the embodiment illustrated in FIGS. 2a to 2c. However, the electronic component 70 differs from the embodiment illustrated in FIGS. 2a to 2c in the form of the outer contacts and in the circuit provided by the electronic component 70.

The electronic component 70 according to the third embodiment provides a power supply with a multiphase output and includes a first contact pad 77 positioned on a first limb portion 78 which provides a first $V_{out}$ terminal, a second contact pad 79 positioned on a second limb portion 80 providing a second $V_{out}$ terminal and a third contact pad 81 positioned on a third limb portion 82 providing a third $V_{out}$ terminal. The contact pads 77, 79 and 81 are separate from one another and electrically insulated from one another by intervening portions of the dielectric layer 71. The position of the contact pads 77, 79, 81 in the body portion 72 is indicated by dashed lines as these portions of the contact pads 77, 79, 81 are covered by an insulation layer 83.

The contact pads 77, 79, 81 may be electrically coupled to corresponding separate contact pads positioned on the lower surface of the respective limb portions 78, 80, 82 by conductive regions 84 arranged on the side faces 85 of the limb portions 78, 80, 82. The further contact pads of the multiphase power supply are arranged on the lower surface 86 of the body portion 72 and cannot, therefore, be seen in the perspective top view of FIG. 3.

Each of the limb portions 75 includes a separate contact pad 87, 88, 89 positioned on its upper surface. The separate contact pads 87, 88, 89 are electrically insulated from one another by regions of the dielectric layer 71 arranged between the limb portions 75. The limb portions 75 may also each include a discrete contact pad on the lower surface which is electrically coupled to the corresponding contact pad on the upper surface by a conductive trace arranged on the side face 83 of the respective limb portion 75.

In embodiments in which the electronic component 70 provides a multiphase output, a separate inductor may be provided for each of the outputs. Each inductor may have a different inductance. The separate inductors may be provided in the form of separate discrete components which are arranged between the corresponding pair of contacts, for example between contact pads 77 and 89 or between contact pads 79 and 88 or between contact pads 81 and 87. The separate inductors may also be provided as cores of a single multicore inductor such that a core of the multicore inductor is electrically coupled between the corresponding pair of contacts, for example between contact pads 77 and 89 or between contact pads 79 and 88 or between contact pads 81 and 87.

The electronic component according to any one of the embodiments described herein may be mounted on a circuit board by way of the surfaces mountable contact pads on its lower surface. The outer contacts provided on the limb portions may be contacted from the top and/or lower side of the electronic component.

The planar form and low height of the electronic component according to any one of the embodiments described herein may be used to provide an arrangement in which the electronic component is mounted on a circuit board underneath a further electronic component. In embodiments in which the electronic component includes a power transistor power stage, for example, the electronic component may be sandwiched between the circuit board and a further electronic component such as a discrete inductor. This may be used to provide a very compact arrangement.

The provision of distal limb portions may be used to enable the electronic component and the discrete inductor to be mounted on a circuit board using a method in which the solder paste for electrically coupling the electronic component to the circuit board and the further electronic component to the electronic component and to the circuit board is applied in a single step and melted in a single reflow process. A method of mounting an electronic component and further electronic component on the circuit board will be described with reference to FIGS. 4a, 4b and 4c.

Figure 4A:
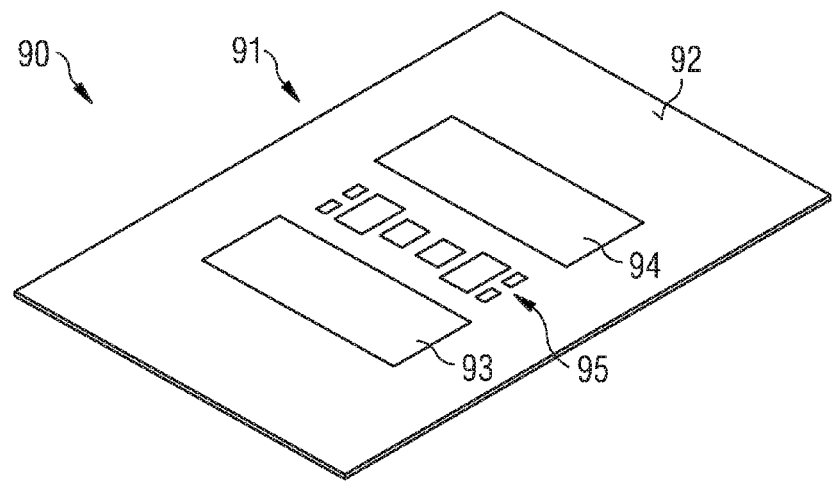
FIG. 4a illustrates a printed circuit board with circuit board contact pads.

FIG. 4a illustrates a perspective top view of a circuit board 90. The circuit board 90 has a plurality of contact pads 91 arranged on its upper surface 92. The contact pads 91 have a lateral arrangement which substantially corresponds to the lateral arrangement of the contact pads on the lower surface of the electronic component which is to be mounted on the contact pads 91. In the embodiment illustrated in FIG. 4a, the electronic component may be the electronic component 30 illustrated in FIGS. 2a to 2c. The plurality of contact pads 91 includes a first contact pad 93 which is substantially rectangular and a second contact pad 94 which is substantially rectangular. The first contact pad 93 is spaced at a distance from the second contact pad 94. The spacing between the first contact pad 93 and the second contact pad 94 corresponds to the breadth of the body portion 32 of the electronic component 30.

A plurality of contact pads 95 which are smaller than the first contact pad 93 and the second contact pad 94 are arranged between the first contact pad 93 and the second contact pad 94. The arrangement of the central contact pads 95 corresponds to the arrangement of the contact pads 62, 63, 64, 65 arranged on the lower surface 48 of the dielectric layer 31 of the electronic component 30. The lateral extent of the first contact pads 93 and the second contact pad 94 is greater than the length $l_l$ of the limb portions 33 of the electronic component 30 which is to be mounted on the circuit board 90.

The arrangement of contact pads 91 is, however, not limited to the specific example illustrated in FIG. 4a, but is adapted to the arrangement of the contact pads of the particular electronic component which is to be mounted on the circuit board 90.

Figure 4B:
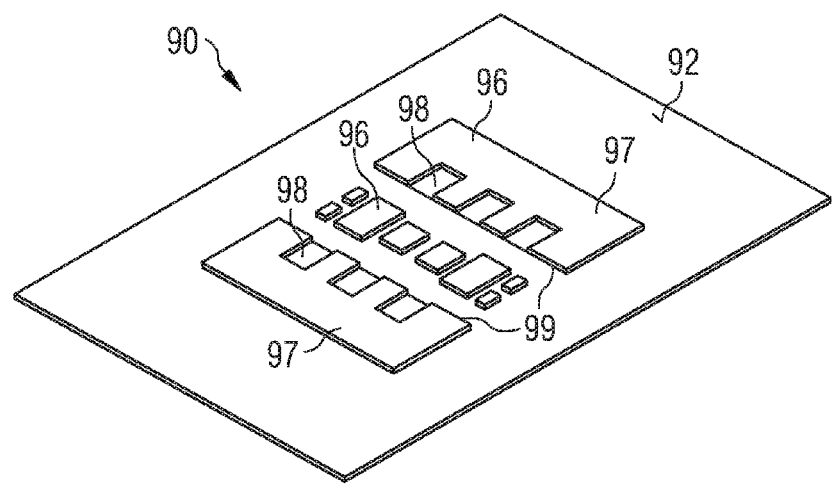
FIG. 4b illustrates the application of solder paste onto the contact pads.

FIG. 4b illustrates the circuit board 90 after a solder paste layer 96 has been applied to the plurality of contact pads 91. The solder paste layer 96 substantially covers the central smaller contact pads 95. In contrast, the solder paste layer 96 is applied to only some portions 97 of the first contact pad 93 and of the second contact pad 94. The solder paste layer 96 on the first contact pad 93 and on the second contact pad 94 has a shape such that three recesses 98 are formed on each of the inwardly facing sides 99 of the first contact pad 93 and of the second contact pad 94. Each recess 98 is substantially free of solder paste and has a shape and extent which generally corresponds to the limb portions 33 of the electronic component 30. The solder layer 96 has a thickness which is substantially that of a thickness $t_e$ of the electronic component 30. The thickness of the solder paste layer 96 may be slightly greater than the thickness of the electronic component 30.

The solder paste layer 96 may be applied using a screen printing technique and, therefore applied having the structured form including the recesses 98 on first contact pad 93 and on the second contact pad 94. Alternatively, the solder paste may be initially applied to substantially cover the first contact pad 93 and the second contact pad 94 and regions of this solder paste layer 96 be removed to create the recesses 98 which are configured to accommodate the limb portions 33 of the electronic component 30.

The solder paste layer 96 may also be applied in other arrangements. For example, the thickness of the solder paste layer 96 applied to the contact pads 95 may be less than the thickness of the solder paste layer 96 applied to the first contact pad 93 and the second contact pad 94 in the regions 97. This arrangement may be used to reduce the spacing between the lower surface of the limb portions 33 of the electronic component 30 and the upper surface of the recesses 98 when the electronic component 30 is arranged on the solder paste layer 96, for example.

The recesses 98 may also include a portion of the solder paste layer 96 which has a thickness which is less than the solder paste layer 96 arranged in the regions 97. This arrangement may be used to ensure that a solder connection is provided between the lower surface of the limb portions 33 and the first contact pad 93 and second contact pad 94 arranged in the recesses 98 and to ensure that the side faces 68 and upper surface 46 of the limb portions 33 are covered with a solder connection produced from the solder paste applied to the regions 97.

The solder paste layer 96 may be arranged only on the plurality of contact pads 91. However, regions of the solder paste layer 96 may be arranged adjacent one or more of the plurality of contact pads 91, for example, adjacent the regions 97 of the first contact pad 93 and second contact pad 94 which include thicker regions of the solder paste layer 96. The regions of the solder paste layer 96 arranged adjacent to the contact pads 91 may be used as an additional source of the solder which flows into the spaces between the circuit board 90 and the electronic component 30 and into spaces between the electronic component 30 and a further electronic component 100. The solder may be encouraged to flow from adjacent regions into the contact pad region by capillary action and/or improved wettability of the materials of the contact pad, for example.

The thickness of the solder paste layer 96 may be varied by applying additional layers of solder paste in regions in which a thicker solder paste layer 96 is desired. A three-dimensionally structured solder paste layer 96 may be produced in a single manufacturing step before the electronic component 30 and any further electronic component 100 are arranged on the solder paste layer 96.

FIG. 4c illustrates the circuit board 90 after the electronic component 30 has been arranged on the contact pads 91 of the circuit board 90. The electronic component 30 is arranged with its lower surface 48 of the dielectric layer 31 positioned facing toward the upper surface 92 of the circuit board 90. The three limb portions 33 extending from the first long side 35 of the body portion 32 are positioned in the recesses 98 in the solder paste layer 96 positioned on the second contact pad 94 and such that the three limb portions 33 extending from the body portion 32 on the opposing long side 36 are positioned in the recesses 98 in the solder paste layer 96 positioned on the first contact pad 93. The contact pads 62, 63, 64, 65 arranged on the lower surface 48 of the electronic component 30 are positioned on the solder paste layer 96 positioned on the corresponding central contact pads 95.

The solder paste layer 96 positioned on the first contact pad 93 and on the second contact pad 94 is uncovered by the electronic component 30, since only the limb portions 33 of the electronic component 30 extend onto the first contact pad 93 and on the second contact pad 94 and these limb portions 33 are arranged in the portions of the first contact pad 93 and the second contact pad 94 which remain substantially free of the solder paste layer 96. The portions 97 of the first contact pad 93 and of the second contact pad 94 which are covered with the solder paste layer 96 may be used for mounting a further electronic component 100 onto one or more of the first contact pad 93 and on the second contact pad 94.

In the embodiment illustrated in FIG. 4c, the further electronic component 100 is a discrete inductor including a first contact pad 101 and a second contact pad 102 having a size and spacing which corresponds to the size and spacing of the first contact pad 93 and the second contact pad 94. The further electronic component 100 is arranged on the upper surface 46 of the electronic component 30 such that the first contact pad 101 is arranged on the second contact pad 94 and the second contact pad 102 is arranged on the first contact pad 93. The electronic component 30 is sandwiched between the lower surface 103 of the further electronic component 100 and the upper surface 92 of the circuit board 90.

The lower surface 103 of the electronic component 100 may include a recess to accommodate the height of at least the body portion 32 of the electronic component 30. However, the contact pads 101 and 102 may have a thickness which accommodates the height of the body portion 32. In which case, the lower surface 103 of the further electronic component 100 may be flat.

After the electronic component 30 and further electronic component 100 are arranged on the circuit board 90, the solder paste layer 96 may be melted, for example in a solder reflow process, to attach the electronic component 30 and further electronic component 100 to the circuit board 90 and to electrically couple the electronic component 30 to the contact pads 93, 95 and the further electronic component 100 to the first contact pad 93 and the second contact pad 94 of the circuit board 90 and to the first trace 61 positioned on the upper surface 46 of the dielectric layer 31 of the limb portions 33 of the electronic component 30. In this embodiment, the limb portions 33 of the electronic component 30 arranged on the first contact pad 93 include contact pads 61', 66' which are not electrically coupled to a component of the electronic component 30. Therefore, these limb portions 33 are used to provide mechanical stability for the electronic component 30 when it is mounted on the circuit board 90.

The contact pads 61, 66' are, however, electrically coupled to the first contact pad 93 of the circuit board 90 and to the second contact pad 102 of the inductor and form a part of the output from the arrangement including the electronic component 30 and inductor 100.

The further electronic component 100 may be mounted such that one contact is mounted on the second contact pad 94 and the second contact is mounted on a further contact pad arranged adjacent the electronic component 30. In this arrangement, the further electronic component overlaps with only the limb portions 33 on the first long side 35. The remainder of the electronic component remains uncovered by the further electronic component.

FIGS. 5a and 5b illustrate cross-sectional views of an arrangement 110 of the further electronic component 100, the electronic component 30 and the circuit board 90 after the solder paste layer 96 has been melted and solder connections have been formed.

FIG. 5a illustrates the arrangement 110 including the further electronic component 100 in form of a discrete inductor, the electronic component 30 and the circuit board 90 along the line A-A indicated in FIG. 4c. The cross-sectional view illustrates the arrangement of the limb portions 33 of the electronic component 30 with respect to the first contact pad 93, second contact pad 94 and one of the plurality of contact pads 95 of the circuit board 90 and with respect to the contact pads 101, 102 of the further electronic component 100.

The electronic component 30 is mounted on the contact pads 91 of the circuit board 90 such that limb portions 33 including the first conductive trace 61 and contact pad 66 are arranged on a portion of the first contact pad 93. The limb portions 33 arranged on the opposing long side of the electronic component 30 overlap a portion of the second contact pad 94. One of the contact pads positioned on the lower surface 48 of the electronic component 30 is mounted on, and electrically coupled to, one of the central contact pads 95.

A solder layer 111 positioned on the second contact pad 94 has a thickness which is slightly greater than the height of the electronic component 30. The solder layer 111 extends from an upper surface 112 of the contact pads 93 to a lower surface 113 of the contact pad 101 of the further electronic component 100. Furthermore, during the solder reflow process, the solder paste layer 96 melts and a small portion of the molten solder flows into regions 114 between a lower surface 115 of the contact pad 66 of the electronic component 30 and the upper surface 112 of the first contact pad 93 and between an upper surface 116 of the first trace 61 and the lower surface 113 of the contact pad 101 of the further electronic component 100. The solidified solder layer 111 electrically couples the contact pad 66, the first trace 61 and electrically conductive traces 67 to the second contact pad 94 of the circuit board 90 and to the first contact pad 101 of the further electronic component 100.

The solder paste layer 96 arranged on the first contact pad 93 melts in a similar fashion so that after the solder reflow process a thin portion 117 is arranged between the upper surface of the contact pad 61' arranged on the upper surface of the limb portion 33 and the lower surface 113 of the contact pad 102 of the further electronic component 100 and between the contact pad 66' arranged on the lower surface of the limb portion 33 and the upper surface 112 of the contact pad 93. Since the limb portion 33 is not electrically coupled to any further component, the arrangement of the solder on the first contact pad 93 provides a mechanical connection for the electronic component 30. The solder layer 111 extends substantially between, and electrically couples, the second contact pad 102 of the further electronic component 100 to the contact pads 61', 66' of the electronic component 30 and to the first contact pad 93 of the circuit board 90.

The contact pads arranged on the lower surface of the body portion 32 of the electronic component 30 are mounted on the plurality of contact pads 95 of the circuit board 90 by a solder connection 118 having a thickness which is substantially similar to the thickness of the solder connections between the contact pads 66, 66' and the second contact pad 94 and first contact pad 93, respectively, since the lower surface of the electronic component 30 is substantially planar.

FIG. 5b illustrates a cross-sectional view of the arrangement 110 along the line B-B, indicated in FIG. 4c, which is positioned between the limb portions 33 of the electronic component 30. The solder layer 111 extends directly between the lower surface 113 of the first contact pad 101 of the further electronic component 100 and the upper surface 112 of the second contact pad 94 of the circuit board 90 over substantially the entire lateral area of the second contact pad 94. The solder layer 111 is therefore, arranged between the adjacent limb portions 33 positioned on the contact pad 94. Similarly, the solder layer 111 extends between the second contact pad 102 of the further electronic component 100 and the first contact pad 93 of the circuit board 90 substantially over the width of the first contact pad 93. Therefore, the limb portions 33 arranged on the first contact pad 93 are substantially surrounded by the solder layer 111.

The solder connections 111 provided by the solder layer surround the upper surface, lower surface and side surfaces of the limb portions 33 and regions between limb portions 33 so that the limb portions 33 of the dielectric layer 31 are embedded within the solder connection 111 on all outer sides. The arrangement, therefore, consists of isolated portions of the dielectric layer 31 embedded within a solder connection 111. The provision of contact pads 61, 66, 67 on the upper surface, lower surface and side faces of the limb portions 33 assists in creating a good bond between the dielectric layer 31 and the solder connections 111 and, in the case of the first trace 61, also electrically couples the semiconductor devices embedded within the body portion 32 to the solder connection 111 and the first contact pad 93.

The solder connections 111 between the trace 61 and the contact pad 101 and between the contact pad 66 and the contact pad 94 are formed by a solder paste source that is positioned adjacent the overlapping area between trace 61 and the contact pad 101 and between the contact pad 66 and the contact pad 94 before it is melted. The narrower width of the limb portions 33 may assist in allowing the solder connections 111 to fill the spaces between the trace 61 and the contact pad 101 and between the contact pad 66 and the contact pad 94. However, other arrangements of the contact pads are possible. For example, in some embodiments, the width of the contact pads of the electronic component may correspond to the width of the body portion of the electronic component.

Figure 6A:
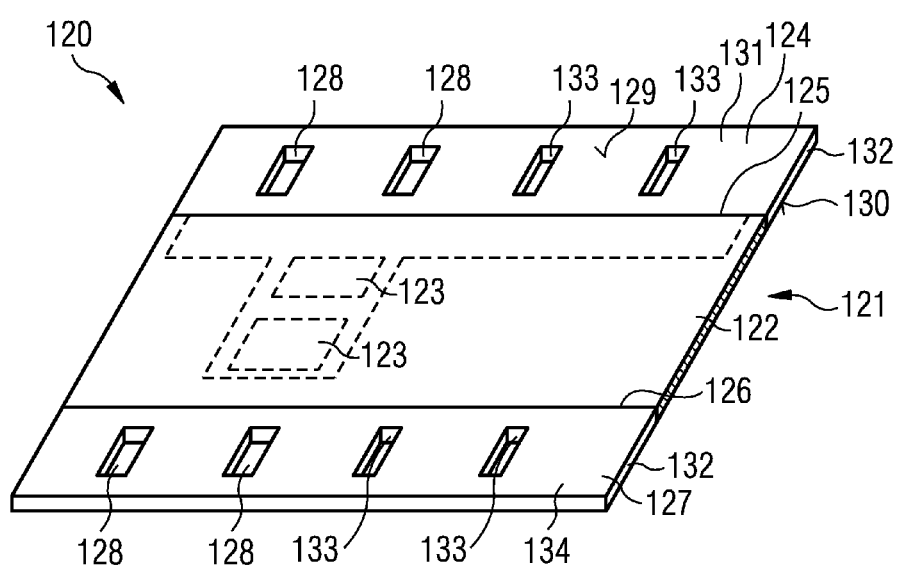
FIG. 6a illustrates a perspective view of the top side of the electronic component according to a fourth embodiment.

FIG. 6a illustrates an electronic component 120 including a dielectric layer 121 having a body portion 122 which is substantially rectangular. At least one semiconductor die 123 is embedded in the body portion 122. The dielectric layer 121 includes a first distal portion 124 extending from a first long side 125 of the body portion 122 and a second distal portion 127 extending from a second long side 126 of the body portion 122. The first distal portion 124 and the second distal portion 127 have a width which is substantially the same as the width of the first long side 125 and second long side 126, respectively. The overall shape of the electronic component 120 is substantially rectangular.

The first distal portion 124 of the dielectric layer 121 includes a plurality of perforations 128 which extend from the upper surface 129 to the lower surface 130. The second distal portion 126 also includes a plurality of perforations 128 which extend from an upper surface 129 to a lower surface 130 of the dielectric layer 121.

The first distal portion 124 includes a contact pad 131 which extends over the upper surface 129, the lower surface 130 and a side face 132 of the first distal portion 124 and over the walls 133 defining the perforations 128. The contact pad 131 further extends onto the body portion 122 and is electrically coupled to the at least one semiconductor die 123.

The first distal portion 124 may be considered to be substantially functionally equivalent to the plurality of limb portions 33 arranged on the first long side 35 of the electronic component 30 illustrated in FIGS. 2a to 2c, 4a to 4c and 5a and 5b.

The second distal portion 127 also includes a contact pad 134 which covers the upper surface 129, the lower surface 130 and the side faces 132 of the dielectric layer 121 and the walls 133 defining the perforations 128. The contact pad 134 is, however, not electrically coupled to any further component of the electronic component 120. The second distal portion 127 with the contact pad 134 may be considered to be functionally equivalent to the limb portions 33 arranged on the opposing long side 36 and the contact pads 61', 66' 67' of the electronic component 30 illustrated in FIGS. 2a to 2c, 4a to 4c and 5a and 5b.

The perforations 128 are illustrated as having a rectangular cross-section and four perforations 128 are provided in each of the distal portions 124, 127. However, the perforations 128 are not limited to this cross-sectional shape and the arrangement of the perforations 128 and number of the perforations 128 as well as the cross-sectional area of the perforations 128 may be varied. For example, the perforations 128 may have a circular cross-section and may be arranged in two or more rows or randomly throughout the distal region 124, 127. The arrangements of the perforations 128 in the first distal region 124 and in the second distal region 127 may differ.

The perforations 128 may be used to encourage solder to flow into the spaces between the contact pads 131, 134 and underlying or overlying contact pads.

Figure 6B:
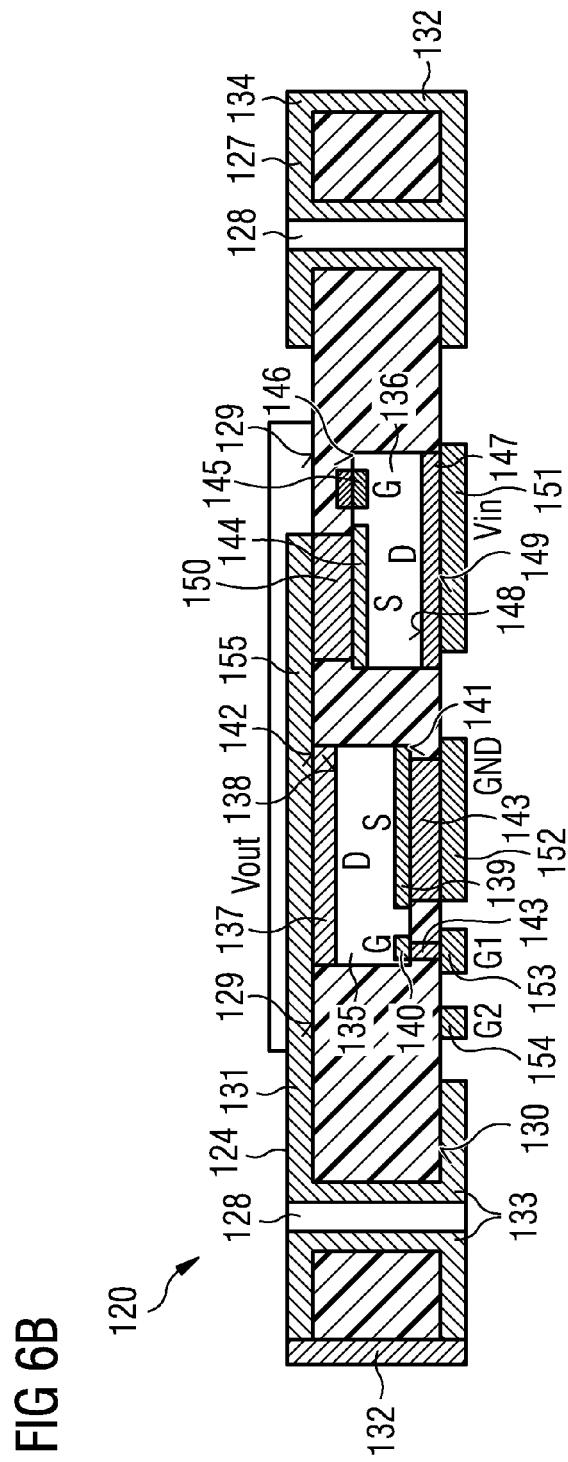
FIG. 6b illustrates a cross-sectional view of the electronic component according to the fourth embodiment.

FIG. 6b illustrates a cross-sectional view of the electronic component 120 and illustrates the circuit provided by the semiconductor dice 123 embedded in the body portion 122 of the dielectric layer 121 in more detail.

The electronic component 120 includes a first transistor device 135 and a second transistor device 136 arranged in a half-bridge configuration in the body portion 122 similar to that of the electronic component 30 according to the second embodiment. The first transistor device 135 includes a drain electrode 137 arranged on its upper surface 138 and a source electrode 139 and a gate electrode 140 arranged on its lower surface 141. An upper surface 142 of the drain electrode 137 is substantially coplanar with the upper surface 129 of the dielectric layer 121. The source electrode 139 and the gate electrode 140 are positioned within the body of the dielectric layer 121 so that the at least one conductive via 143 extends between the source electrode 139 and the gate electrode 140 and the lower surface 130 of the dielectric layer 121.

The second transistor device 136 includes a source electrode 144 and a gate electrode 145 on its upper surface 146 and a drain electrode 147 on its lower surface 148. The lower surface 149 of the drain electrode 147 is substantially coplanar with the lower surface 130 of the dielectric layer 121. The source electrode 144 and the gate electrode 145 are positioned within the body of the dielectric layer 121. A conductive via 150 is positioned between the source electrode 144 and the upper surface of 129 of the dielectric layer 121.

The electronic component 120 includes a plurality of contact pads positioned on the lower surface 130 of the body portion 122 of the dielectric layer 121. A first contact pad providing a drain pad 151 is positioned on, and electrically coupled to, the drain electrode 147 of the second transistor 136. At least one ground pad 152 is positioned on the conductive via 143 and is electrically coupled to the source electrode 139 of the first transistor device 135. A first gate pad 153 is positioned on the conductive via 143 and is electrically coupled to the gate electrode 140 of the first transistor device 135. A second gate pad 154 is positioned on the lower surface 130 of the body portion 122 and is electrically coupled to the gate electrode 145 of the second transistor device 136.

The source electrode 144 of the second transistor device 136 is electrically coupled to the drain electrode 137 of the first transistor device 135 by means of a contact pad 155 which extends between the conductive via 150 and the drain electrode 137 on the upper surface 129 of the body portion 122. The conductive pad 150 further extends into the first distal portion 124 and extends into the contact pad 131 which is positioned on the upper surface 129, lower surface 130 and side face 132 of the first distal region 124.

Figure 6C:
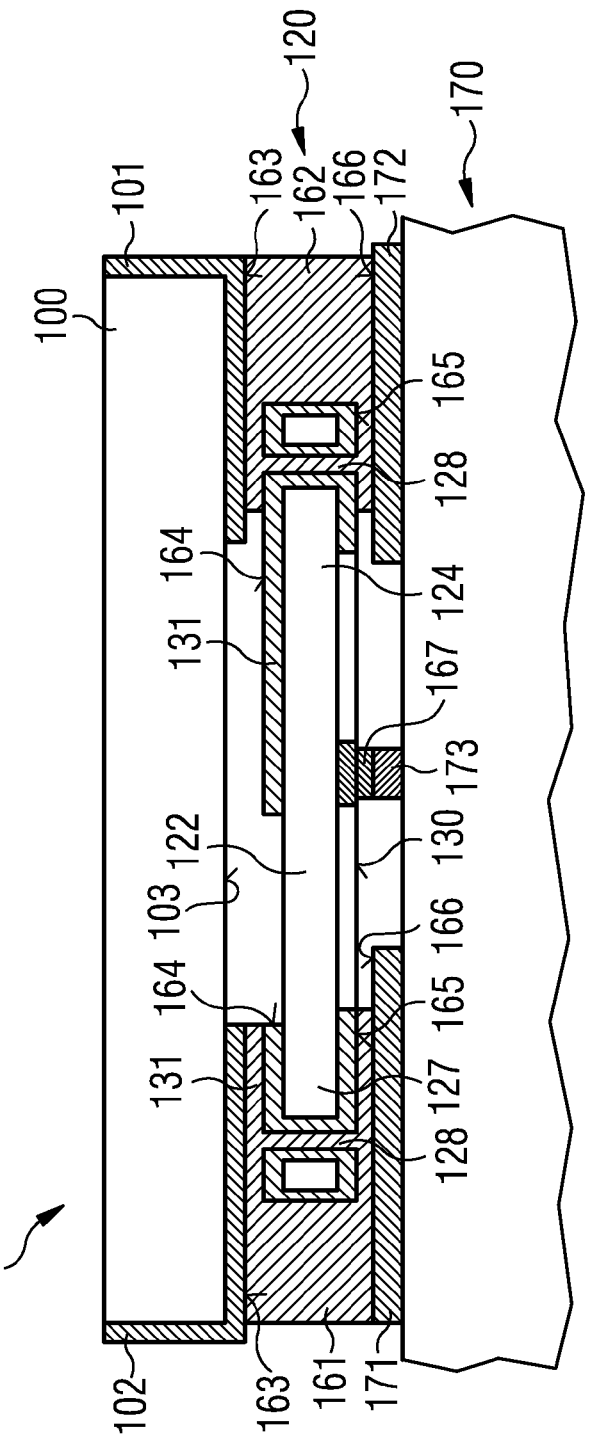
FIG. 6c illustrates a cross-sectional view of the electronic component according to the fourth embodiment and a further electronic component mounted on a circuit board.

FIG. 6c illustrates an arrangement in which the electronic component 120 according to the fourth embodiment is mounted in a stack with a further electronic component, in particular a discrete inductor 100, on a circuit board 170. The circuit board 170 includes a first circuit board contact pad 171 configured to accommodate the second distal portion 127 and a second circuit board contact pad 172 configured to accommodate the first distal region 124 of the electronic component 120. A plurality of smaller circuit board contact pads 173 is arranged between the first circuit board contact pad 171 and the second circuit board contact pad 172. The size and arrangement of the plurality of smaller contact pads 173 is configured to match the contact pads arranged on the lower surface 130 of the body portion 122 of the electronic component 120.

The second distal portion 127 is arranged on a portion of the first circuit board contact pad 171 and the first distal portion 124 is positioned on a portion of the second circuit board contact pad 172. The first contact pad 101 of the inductor 100 is arranged on the first distal portion 124 and the second contact pad 102 is positioned on the second distal portion 127 of the electronic component 120.

The arrangement 160 is illustrated in FIG. 6c after the solder reflow process and illustrates a solder connection 161 between the second contact pad 102 of the inductor 100 and the first circuit board contact pad 171 and a solder connection 162 between the first contact pad 101 of the inductor 100 and the second circuit board contact pad 172. The solder connection 161 extends in regions between the lower surface 163 of the second contact pad 102 and the upper surface 164 of the contact pad 134 of the electronic component 120 and between the lower surface 165 of the contact pad 134 positioned on the lower surface 130 of the second distal portion 127 of the electronic component 120 and the upper surface 166 of the first circuit board contact pad 171. The solder connection 161 is also positioned in the perforations 128 positioned in the second distal portion 127.

The second solder connection 162 is positioned in regions between the lower surface 163 of the first contact pad 101 of the inductor 100 and the upper surface 164 of the contact pad 134 of the electronic component 120 and between the lower surface 165 of the contact pad 131 of the electronic component 120 and the upper surface 166 of the second circuit board contact pad 172. The solder connection 162 is also positioned in the perforation 128 in the first distal portion 124.

The dielectric layer 121 of the first distal portion 124 and of the second distal portion 127 is embedded within the solder connections 162, 161, respectively. The arrangement 160 further includes solder connections 167 arranged between the contact pads on the lower surface 130 of the electronic component 120 and the circuit board contact pads 173.

The solder connection 162 provides an electrical connection between the first contact pad 101 of the inductor 100 and the contact pad 131 of the electronic component 120 and, therefore, to the transistor devices 135, 136. The solder connection 162 also provides an electrical connection between the first contact pad 101 of the inductor 100 and the second circuit board contact pad 172.

The solder connection 161 electrically couples the second contact pad 102 of the inductor 100 with the contact pad 134 positioned on the second distal portion 127 of the electronic component 120 and with the circuit board contact pad 171.

The electronic component 30 and the arrangement 110 including the further electronic component 100 in the form of an inductor and the electronic component 120 and the arrangement 160 may be used to provide a portion of a power supply apparatus, such as a DC-DC converter. The DC-DC converter may form part of an AC/DC converter, for example part of a switch mode power supply.

Figure 7:
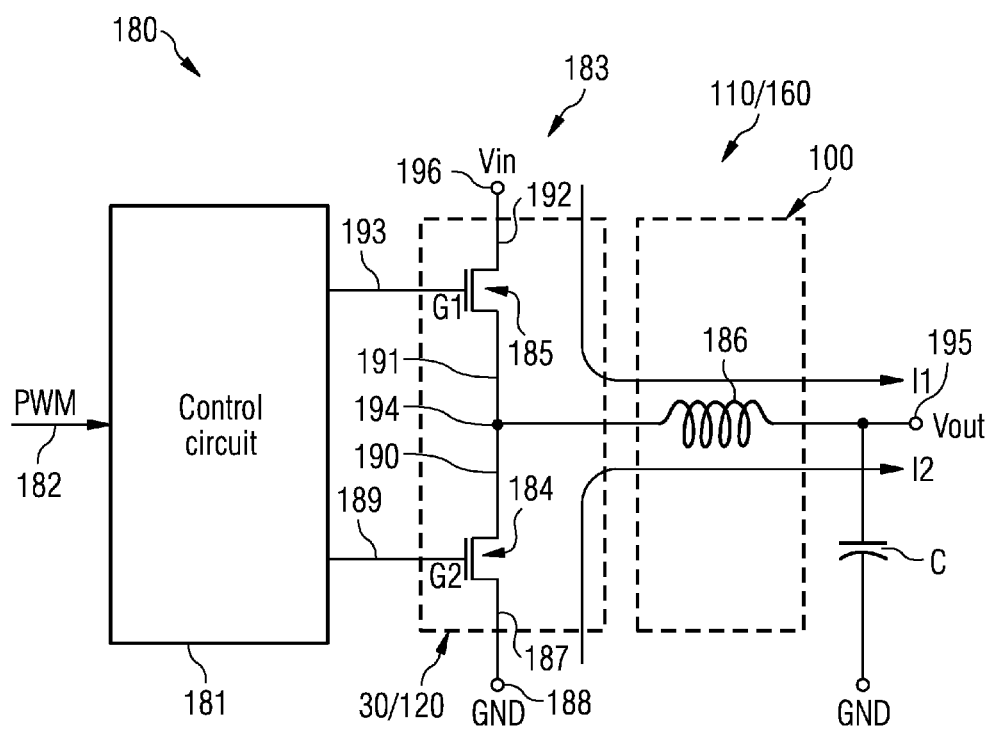
FIG. 7 illustrates an application including a first electronic component and a second electronic component in a power correction factor circuit.

FIG. 7 illustrates an example of a power supply apparatus 180 in which the electronic component 30, or the electronic component 120 and/or the arrangement 110, or the arrangement 160 may be used.

The power supply apparatus 180 includes a control circuit 181 which receives a pulse width modulation input signal 182, a half-bridge circuit 183 including a low side transistor 184 coupled to a high side transistor 185 and an inductor 186. A source 187 of the low side transistor 184 is coupled to a ground terminal 188, a gate 189 of the low side transistor 184 is controlled by the control circuit 181 and a drain 190 of the low side transistor 184 is coupled to a source 191 of the high side transistor 185. A drain 192 of the high side transistor 185 is coupled to a $V_{in}$ terminal 196 and a gate 193 is coupled to the control circuit 181. The inductor 186 is coupled between a node 194 between the drain 190 of the low side transistor 184 and the source 191 of the high side transistor 185 and a $V_{out}$ terminal 195. The inductor 186 may also be grounded via a capacitor.

The control circuit 181 is used to turn on or turn off the low side transistor 184 and high side transistor 185. In particular, the control circuit 181 outputs control signals with reversed polarity to the gates 189, 193 of the high side transistor 185 and the low side transistor 184 thereby stepping down the input voltage $V_{in}$ to the output voltage $V_{out}$.

The half-bridge circuit 183 may be provided by the electronic component 30 illustrated in FIGS. 2a to 2c or the electronic component 120 illustrated in FIGS. 6a and 6b. The half-bridge circuit 183 and inductor 186 may be provided by the arrangement 110 illustrated in FIGS. 5a and 5b or the arrangement illustrated in FIG. 6c. In further embodiments, the control circuit 181 is embedded within the electronic circuit of the electronic component 30 or electronic component 120.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A method, comprising:
applying a layer of solder paste to a portion of a circuit board;
arranging a first contact pad of a first electronic component adjacent the layer of solder paste, the first electronic component comprising a dielectric layer, at least one semiconductor die embedded in the dielectric layer, the first contact pad being electrically coupled to the semiconductor die and arranged on a lower side of the dielectric layer, and a second contact pad positioned on an upper side of the dielectric layer; and
melting the solder paste to produce a molten solder that flows onto at least one of the first contact pad and the second contact pad of the first electronic component,
wherein there is no solder material from the solder paste present on the first contact pad and there is no solder material from solder paste present on the second contact pad until after the melting step.

2. The method according to claim 1, wherein at least a portion of the layer of solder paste is applied adjacent a circuit board contact pad.

3. The method according to claim 2, wherein the first contact pad of the first electronic component is arranged on the circuit board contact pad and the solder paste is melted to produce a molten solder that flows into regions between the first contact pad of the first electronic component and the circuit board contact pad.

4. The method according to claim 1, wherein the solder paste layer is applied to a first portion of a circuit board contact pad of a circuit board, a further portion of the circuit board contact pad remaining substantially free of the solder paste.

5. The method according to claim 4, wherein the first contact pad of the first electronic component is arranged on the further portion of the circuit board contact pad remaining substantially free of the solder paste.

6. The method according to claim 1, wherein the applying the solder paste comprises applying a first solder paste layer having a first thickness to a first portion of the circuit board and applying a second solder paste layer having a second thickness to a second portion of the circuit board, the second thickness being greater than the first thickness.

7. The method according to claim 1, wherein the applying the solder paste comprises applying a first solder paste layer having a first thickness to a first area of a circuit board contact pad of a circuit board, applying a second solder paste layer having a second thickness to a portion of the first area, wherein the second thickness is different from the first thickness.

8. A method, comprising:
applying a layer of solder paste to a portion of a circuit board;
arranging a first contact pad of a first electronic component adjacent the layer of solder paste, the first electronic component comprising a dielectric layer, at least one semiconductor die embedded in the dielectric layer, the first contact pad being electrically coupled to the semiconductor die and arranged on a lower side of the dielectric layer, and a second contact pad positioned on an upper side of the dielectric layer;

melting the solder paste to produce a molten solder that flows onto at least one of the first contact pad and the second contact pad of the first electronic component; and arranging a first contact of a second electronic component on the first contact pad of the first electronic component and melting the solder paste to produce a molten solder that flows into regions between the second contact pad of the first electronic component and the first contact of the second electronic component.

9. The method according to claim 8, wherein the first contact of the second electronic component is arranged on the first contact pad of the first electronic component and on a second circuit board contact pad such that the first electronic component is sandwiched between the second electronic component and the circuit board.

10. The method according to claim 1, wherein the solder paste is applied as a structured layer having a thickness that is at least equal to a thickness of the first electronic component.

11. The method according to claim 1, wherein the solder paste layer has a shape corresponding to the shape of the first contact pad of the first electronic component.

12. The method according to claim 1, further comprising arranging a third contact pad of the first electronic component on a second circuit board contact pad, the third contact pad being arranged on the underside of the dielectric layer.

13. The method according to claim 12, wherein the solder paste is applied to adjacent to the third contact pad.

14. The method according to claim 12, wherein the solder paste is applied to at least a portion of the third contact pad.

15. A method, comprising:
applying a layer of solder paste to a portion of a circuit board;
arranging a first contact pad of a first electronic component adjacent the layer of solder paste, the first electronic component comprising a dielectric layer, at least one semiconductor die embedded in the dielectric layer, the first contact pad being electrically coupled to the semiconductor die and arranged on a lower side of the dielectric layer, and a second contact pad positioned on an upper side of the dielectric layer;
melting the solder paste to produce a molten solder that flows onto at least one of the first contact pad and the second contact pad of the first electronic component;
arranging a third contact pad of the first electronic component on a second circuit board contact pad, the third contact pad being arranged on the underside of the dielectric layer; and
arranging a first contact of a second electronic component on the first contact pad of the first electronic component and a second contact of the second electronic component onto a fourth contact pad on the upper surface of the first electronic component and melting the solder paste to produce a molten solder that flows into regions between the second contact pad of the first electronic component and the first contact of the second electronic component and the fourth contact pad of the first electronic component and the second contact of the second electronic component.

16. The method according to claim 15, wherein the solder paste is melted and resolidified such that the first contact of the second electronic component is electrically coupled to the first contact pad, the second contact pad of the first electronic component and the first circuit board contact pad and such that the second contact of the second electronic component is electrically coupled to the third contact pad and the fourth contact pad of the first electronic component and the second circuit board contact pad.

17. The method according to claim 1, wherein the dielectric layer of the first electronic component comprises a distal portion, the first contact pad being arranged on the lower side of the distal portion and the second contact pad being arranged on the upper side of the distal portion and the side faces of the distal portion are arranged adjacent the solder paste.

18. The method according to claim 1, wherein the dielectric layer of the first electronic component comprises at least one limb portion, the first contact pad being arranged on the lower side of the limb portion and the second contact pad being arranged on the upper side of the limb portion and the side faces of the limb portion are arranged adjacent the solder paste.

19. A method, comprising:
applying solder paste to a portion of a circuit board contact pad of a circuit board, a further portion of the circuit board contact pad remaining substantially free of the solder paste;
arranging a limb portion of a first electronic component on the further portion of the circuit board contact pad, the first electronic component comprising a dielectric layer comprising the limb portion extending from a body portion, at least one semiconductor die embedded in the body portion and at least one first contact pad positioned on an upper side of the limb portion and at least one second contact pad positioned on a lower side of the limb portion, the at least one first contact pad being electrically coupled to the at least one semiconductor die;
arranging a first contact of a second electronic component on the limb portion of the first electronic component and on the solder paste; and
melting the solder paste.

20. The method according to claim 19, wherein the solder paste is applied as a structured layer having a thickness that is at least equal to a thickness of the first electronic component.

21. The method according to claim 19, wherein the solder paste is melted such that solder flows into regions between the limb portion and the circuit board contact pad and between the limb portion and the contact of the second electronic component.

22. The method according to claim 1, wherein the solder paste is laterally adjacent the first contact pad of the first electronic component, and wherein the molten solder flows laterally onto the contact pad.

23. The method according to claim 2, wherein the interface and volume between the first contact pad of the first electronic component and the circuit board contact pad is free of solder paste.

* * * * *